(12) United States Patent
Kawamura et al.

(10) Patent No.: US 6,841,404 B2
(45) Date of Patent: Jan. 11, 2005

(54) METHOD FOR DETERMINING OPTICAL CONSTANT OF ANTIREFLECTIVE LAYER, AND METHOD FOR FORMING RESIST PATTERN

(75) Inventors: Daisuke Kawamura, Kanagawa (JP); Eishi Shiobara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 10/237,735

(22) Filed: Sep. 10, 2002

(65) Prior Publication Data

US 2003/0064534 A1 Apr. 3, 2003

(30) Foreign Application Priority Data

Sep. 11, 2001 (JP) .................................... 2001/275014

(51) Int. Cl.[7] .............................................. H01L 21/66
(52) U.S. Cl. .............................. 438/16; 438/72; 438/636
(58) Field of Search ............................ 438/16, 72, 636, 438/952; 430/272.1, 159; 428/446; 324/405, 716, 719, 752

(56) References Cited

U.S. PATENT DOCUMENTS 5,698,352 A * 12/1997 Ogawa et al. .............. 257/629

FOREIGN PATENT DOCUMENTS

| JP | 07-078747 | 3/1995 |
|---|---|---|
| JP | 07-201708 | 8/1995 |
| JP | 8-78322 | 3/1996 |
| JP | 2897691 | 3/1999 |
| JP | 2897692 | 3/1999 |
| JP | 2953348 | 7/1999 |
| JP | 2953349 | 7/1999 |

OTHER PUBLICATIONS

Theodore H. Fedynyshyn, et al. "Prospects for Using Existing Resists for Evaluating 157–nm Imaging Systems", Proceedings of SPIE, vol. 3999, (2000).
D. Kawamura, et al., "Study on Anti Reflective Layer for 157nm Lithography", Extended Abstracts of the 62nd Autumn Meeting, 2001, 12a–E–19, The Japan Society of Applied Physics, pp 536, (2001).

* cited by examiner

Primary Examiner—Kamand Cuneo
Assistant Examiner—Lisa Kilday
(74) Attorney, Agent, or Firm—Finnegan, Henderson, Farabow, Garrett & Dunner, L.L.P.

(57) ABSTRACT

A method for determining an optical constant of an bottom antireflective layer formed between a resist film and an underlying substrate in an optical lithography process in a process for fabricating a semiconductor device, the resist film having an absorption coefficient $\alpha'$ of 1.5 $\mu m^{-1}$ to 3.0 $\mu m^{-1}$ with respect to an exposure wavelength, a base of the absorption coefficient $\alpha'$ being 10, the method includes expressing an nominal dose due to a variation in thickness of the resist film by the sum of a monotonic increase term and a damped oscillation term, and selecting an optical constant of the bottom antireflective layer so that a minimum value closing to a maximum point indicative of a maximum value on a curve of a variation in the nominal dose on a side that the thickness is larger than that at the maximum point is substantially equal to the maximum value, or so that no maximum point exist on the curve wherein, expressing an exposure wavelength by $\lambda$ and an extinction coefficient of the resist film by $\kappa$, the absorption coefficient $\alpha'$ is a value having the following relationship with the $\lambda$ and the $\kappa$.

$$\alpha' = \frac{4\pi\kappa}{\lambda}\log_{10}(\exp)$$

14 Claims, 12 Drawing Sheets

λ 157nm, NA0.8, σ 0.85, ε 0.67, t6%, 70nmLS
Resist1.74−0.06i, BARC2.325−0.8i

METHOD FOR DETERMINING OPTICAL CONSTANT OF ANTIREFLECTIVE LAYER, AND METHOD FOR FORMING RESIST PATTERN

CROSS REFERENCE TO RELATED APPLICATION

This application claims benefit of priority under 35 USC §119 to Japanese patent application No. 2001-275014, filed on Sep. 11, 2001, the contents of which are incorporated by reference herein.

BACKGROUND OF THE INVENTION

1. Field of the Invention

The present invention generally relates to a method for determining an optical constant of a material suitable for an antireflective layer which is used in the optical lithography process in the fabrication of a semiconductor, and a method for forming a resist pattern.

2. Description of the Prior Art

In accordance with the scale down of design rules for semiconductor devices, it is required to shorten the wavelength of a light source of an exposure system. In the 70 nm design rule, an $F_2$ laser having a wavelength of 157 nm has been considered as the light source, and exposure systems and resists suitable for this light have been developed.

In the optical lithography process, if then resist thickness varies by the coating method (usually, the spin coating) and topography of the underlying substrate, the dimension of a resist pattern or nominal dose varies by the thin film interference. In addition, if the resist is coated on the transparent or substantially transparent and if the thickness of the transparent layer varies by the topography of the layer just below the transparent layer, or if the kind of the under layer is different from place to place, the dimension and nominal dose vary by the thin film interference effect. There is naturally a limit to the improvement of the flatness of the underlying substrate due to the coating uniformity of a resist film, CMP and so forth. In order to cause a semiconductor device to show an expected performance, it is required to confine the above described variation in dimension within a predetermined range. This inversely defines an allowable variation range of the resist thickness, or an allowable variation range of nominal dose which is calculated from it by a lithography process margin.

If the contrast of optical image decreases by the scale down of the pattern, the allowable value of variation in nominal dose also decreases. For that reason, the required levels of the above described coating uniformity and the flatness of the underlying substrate are increased.

According to studies separately carried out by the inventors, even if an exposure system having a numerical aperture NA=0.8 and an illumination coherency σ=about 0.85, and a half-tone mask are used in order to form a pattern in the 70 nm rule by means of a 157 nm light source, the lithography process margin may be only about 8% exposure latitude with 0.2 μm DOF (depth of focus). On these optical conditions, it is predicted that the variation in nominal dose due to the variation in thickness of the resist must be 1% at the maximum, probably 0.5% or less.

Since such materials as aromatic rings, carbon-carbon bonds, carbonyl groups, which constitute a resist, have a strong absorptivity with respect to light having a wavelength of 157 nm, it is actually impossible to use these materials as the materials of the resist for conventional light sources, such as I-line (365 nm light), a KrF laser (248 nm light) and an ArF later (193 nm light).

The relationship between an absorption coefficient α', an extinction coefficient κ and a transmittance T is herein shown. Assuming that the intensity of transmitted light is I when light entering a material having an optical constant n-iκ at intensity $I_0$ passes through the material by a distance x, the transmittance T is $T=I/I_0=10^{-\alpha'x}$, and an absorption coefficient α' is expressed by the following expression.

$$\alpha' = \frac{4\pi\kappa\log_{10}(\exp)}{\lambda} \quad (1)$$

That is, the transmittance is lower as the transmission distance x is longer, as the extinction coefficient κ (or absorption coefficient α') is larger, and the wavelength λ is shorter.

In the 157 nm light source, the absorption of 366 nm light and 248 nm light by resist films used for conventional light sources is very high. For example, a typical resist which is used for 248 nm light and which contains a polyhydroxystyrene derivative as a base resin has an extinction coefficient $\kappa'_{248nm} \approx 0.01$ μm$^{-1}$ and an absorbance $\alpha'_{248nm} < 0.22$ μm$^{-1}$, so that absorption is very small. However, with respect to 157 nm light, the resist has very strong absorptivity so as to have $\kappa'_{157nm} \approx 0.2$ μm$^{-1}$ and an absorbance $\alpha'_{157nm} < 6.95$ μm$^{31\ 1}$.

A typical resist which is used for KrF light sources and which contains a hydroxystyrene derivative as a base resin has an absorption coefficient α'=0.22 μm$^{-1}$ at 248 nm, and has a high transparency so as to have a transmittance of 73.8% even in the case of a resist thickness of 600 nm. On the other hand, with respect to 157 nm light, α'=7–8 μm$^{-1}$, and the transmittance is only 20% even if the thickness of the resist film is not more than 100 nm. For that reason, the thickness is greatly reduced after development. The transmittance exceeds 70% when the thickness of the resist film is 20 nm or less. on the other hand, the resist pattern also serves as an etching mask for the underlying substrate. Since the thickness of the layer to be processed (the underlying substrate) hardly varies or increases by the scale down of the pattern, the thickness of the resist pattern is preferably as thicker as possible although the lowering of the lithography process margin is limited to an allowable range. In the case of a resist film having a thickness of about 20 nm, it is very difficult to process an underlying substrate even if a hard mask process is used.

Mainly for the above described reasons, a resist material using a fluororesin or a fluorine containing siloxane, which has a high transparency with respect to 157 nm light, as a base resin has been developed. According to reports in documents and societies, a resist film showing relatively high resolution for 157 nm light has an extinction coefficient $\kappa'_{157\ nm}$=0.04–0.1 and an absorbance $\alpha'_{157}$=1.04–3.48 μm$^{-1}$. In order to improve the sensitivity of exposure so as to meet the requirements of a high resolution due to the improvement of dissolution contrast, the light irradiation resistance of the optical system of the exposure tools and a low laser intensity, it is required to increase the amounts of dissolution inhibiting group units and PAG (photo acid generator). As a result of the increase of the amounts of such structure or materials, a resist having an absorption coefficient α'<1 μm$^{-1}$ (κ≈0.029) is reported to exist. However, since the dissolution inhibiting group units and the PAG have high absorption, even if the resist has a high resolution and a high sensitivity, the absorption coefficient thereof is about α'=1.5–2 μm$^{-1}$ (κ=0.043–0.058), so that the transparency thereof is far lower than that used for conventional wavelengths. Although resist materials have been subsequently developed, it is difficult to consider that it is possible to obtain high resolution resist materials having a high absorptivity with the same absorption coefficient α' as conventional wavelengths.

In the optical lithography process, bottom antireflective layers have been generally used. The object of the use of the bottom antireflective layer is as follows. The thickness of the resist on the underlying substrate has the variation in thickness due to the inplane uniformity in the resist coating method and the topography of the underlying substrate produced by processing. And if the transparent layer between substrate and resist (which will be hereinafter referred to as a "transparent substrate") exist, the thickness or/and the kind of the substrate materials just below transparent substrate has variation in each place. The object of the use of the bottom antireflective layer is to prevent the variation in a desired resist pattern dimension or nominal dose (which will be hereinafter simply referred to as an "nominal dose") and the irregularities of the side walls of the resist pattern derived from standing waves due to the variation in thickness of the resist film and/or transparent substrate and the like by the thin film interference effect. If it is difficult to suppress the nominal dose only by an interference type bottom antireflective layer, since the variation in thickness of the transparent substrate is large and/or the substrate materials just below transparent substrate are different every place, it is effective to provide a shading film between the underlying transparent substrate and the interference type bottom antireflective layer as disclosed in Japanese Patent Laid-Open No. 8-78322 and so forth.

In an ideal reference reducing coating in the optical lithography process, the side wall of the resist pattern does not have irregularities due to the standing waves, and the nominal dose does not vary due to the variation in thickness of the resist and transparent substrate. The flatness of the side wall of the pattern can be achieved if the reflectance of the interface between the resist film and the bottom antireflective layer is 0 when it is considered to include reflected light from the interface in a lower layer.

However, it is impossible to cause the variation of the nominal dose to be completely 0 since the resist film itself has absorptivity and the inplane variation in thickness of the resist can't be 0. In fact, the allowable value of the variation in nominal dose caused by the variation in thickness of the resist and transparent substrate is determined by a simulative or experimental lithography process margin of desired pattern. Since the optical image deteriorates to lower the lithography process margin with the scale down of the pattern, the range of allowable values of the variation in nominal dose is narrowed, so that it is required to use a bottom antireflective layer having an appropriate optical constant and thickness.

If the resist film has a high transparency, i.e., a very low absorbance α', the nominal dose of a desired resist pattern fluctuates due to the variation in thickness of the resist film, but the variation of the center line or envelope is very small. FIG. 22 shows the results of calculation of the variation in nominal dose due to the thickness of a resist film AR3produced by Siplay Company and formed on a polysilicon so as to have a thickness of 60 nm, and a resist film when the reflection on the interface between the resist film and the underlying substrate is 0 (i.e. optical constant of resist and underlayer just below to resist is equal, and the thickness of the under layer is thick enough), with respect to 248 nm light. When the transparency of the resist film is high, if the reflectance on the interface between the resist film and the bottom antireflective layer is decreased and if the nominal dose curve approaches a curve on which the reflectance is 0, the variation range of nominal dose due to the variation in thickness of the resist film can be very small. In fact, as described above, since it is impossible to cause the reflection on the interface to be completely 0, it is desired to use a thickness in a region in which the rate of change is small on the nominal dose curve, i.e., in the vicinity of the extreme value, after decreasing the reflectance as lower as possible. For example, when AR3 produced by Siplay Company is formed on a polysilicon so as to have a thickness of 60 nm, if it is assumed that the variation of nominal dose ΔEop=1.5%, the variation of resist thickness ΔTr=15.8 nm is allowable. In addition, if ΔEop=1.0%, ΔTr=12.8 nm is allowable.

FIG. 23 shows an example of the variation of nominal dose due to the variation of resist thickness in the case of 157 nm light. In this figure, "Resist" denotes a resist film, and "BARC" denotes a bottom antireflective layer. This point is the same as that in each of figures which will be described later.

As shown in FIG. 23, in the case of 157 nm light, the increase of the nominal dose due to the increase of the resist thickness is remarkably larger than that in the example of 248 nm light shown in FIG. 22. For that reason, it is impossible to inhibit the variation of nominal dose with respect to the variation of resist thickness by half period or more of vibration components. In the case of 157 nm light, the period of vibration components is shorter than that of 248 nm light in accordance with the period of the standing waves in the film, so that the variation in nominal dose is easy to be great even if the amplitude of the vibration components is the same.

Examples of calculating methods for optical constants and thickness suitable for bottom antireflective layers are disclosed in Japanese Patent Nos. 2897691, 2897692, 2953348 and 2953349.

In the above described prior arts, optical constants of appropriate bottom antireflective layers are calculated with respect to the same thickness of a plurality of resist films with optical constants in the above described range of calculation. Furthermore, the quantity of absorbed light in the prior inventions is associated with the nominal dose in the specification.

However, in these four prior arts, only the materials of the bottom antireflective layers are different, and a method for determining an optical constant and thickness suitable for the bottom antireflective layer is the same. Therefore, although the above described prior arts are effective when the transparency of the resist film is high like the conventional wavelength, there is a problem in that it is not possible to obtain an optical constant suitable for an bottom antireflective layer or it is difficult to automate calculation when the transparency is low like the above described resist film using 157 nm light.

That is, the thickness of the resist film inhibiting the variation in nominal dose varies in accordance with the optical constant of the bottom antireflective layer. In the above described four prior arts, it is considered that it is determined that optical constant of the antireflective layer is suitable only when the range of the thickness of the resist film changed by calculation is sufficiently narrow. In order to obtain an optical constant suitable for a bottom antireflective layer even if the transparency is low, it is required to divide the optical constant of the bottom antireflective layer into a large number of regions to change the thickness of the resist film utilized for calculation for every divided region. However, the above described prior arts fail to disclose such descriptions.

Thus, in a resist film having insufficient transparency, it is required to provide idea different from conventional ides, with respect to the determination of an optical constant of the optimum bottom antireflective layer.

BRIEF SUMMARY OF THE INVENTION

According to a first aspect of the present invention, there is provided a method for determining an optical constant of an bottom antireflective layer formed between a resist film and an underlying substrate in an optical lithography process in a process for fabricating a semiconductor device, the resist film having an absorption coefficient $\alpha'$ of 1.5 $\mu m^{-1}$ to 3.0 $\mu m^{-1}$ with respect to an exposure wavelength, a base of the absorption coefficient $\alpha'$ being 10, the method comprising: expressing an nominal dose due to a variation in thickness of the resist film by the sum of a monotonic increase term and a damped oscillation term; and selecting an optical constant of the bottom antireflective layer so that a minimum value closing to a maximum point indicative of a maximum value on a curve of a variation in the nominal dose on a side that the thickness is larger than that at the maximum point is substantially equal to the maximum value, or so that no maximum point exist on the curve; wherein, expressing an exposure wavelength by $\lambda$ and an extinction coefficient of the resist film by $\kappa$, the absorption coefficient $\alpha'$ is a value having the following relationship with the $\lambda$ and the $\kappa$.

$$\alpha' = \frac{4\pi\kappa}{\lambda}\log_{10}(\exp)$$

According to a second aspect of the present invention, there is provided a method for forming a resist pattern for use in an optical lithography process for forming an bottom antireflective layer having an optical constant of n-i$\kappa$ and a thickness d of 8.193/$\kappa$ [nm] on an underlying substrate for fabrication of a semiconductor device, and for forming a resist film on the bottom antireflective layer, the method comprising: using a light source which emits rays of light having a wave length of 157 nm, and a resist film which has an absorption coefficient $\alpha'$ of 1.5 $\mu m^{-1}$ to 3.0 $\mu m^{-1}$ with respect to an exposure wavelength, a base of the absorption coefficient $\alpha'$ being 10, and which contains a fluorine containing resin or siloxane resin; wherein an optical constant n-i$\kappa$ of the bottom antireflective layer is included in a range determined by being selected so that an nominal dose due to a variation in thickness of the resist film is expressed by the sum of a monotonic increase term and a damped oscillation term and so that a minimum value closing to a maximum point indicative of a maximum value on a curve of variation in the nominal dose on a side that the thickness is larger than that at the maximum point is substantially equal to the maximum value, or so that no maximum point exist on the curve, and expressing an exposure wavelength by $\lambda$ and an extinction coefficient of the resist film by $\kappa$, the absorption coefficient $\alpha'$ is a value having the following relationship with $\lambda$ and the $\kappa$.

$$\alpha' = \frac{4\pi\kappa}{\lambda}\log_{10}(\exp)$$

According to a third aspect of the present invention, there is provided a method for forming a resist pattern using an optical lithography process for forming an bottom antireflective layer having an optical constant of n-i$\kappa$ and a thickness d of 8.193/$\kappa$ [nm] on an underlying substrate for a semiconductor device to be fabricated and for forming a resist film on the bottom antireflective layer, the method comprising: using a light source emitting rays of light having a wavelength of 157 nm, and a resist film containing a fluorine containing resin or siloxane resin; and selecting an intensity reflectance Ron the interface between the resist film and the antireflective layer so as to meet the following expression, assuming that an optical constant of the resist film is n'-i$\kappa'$.

$$2.06+17677\times(\kappa')^{3.25} \geq R \geq 0.01+14059\times(\kappa')^{3.37}$$

According to a fourth aspect of the present invention, there is provided a method for forming a resist pattern used in an optical lithography process for forming an bottom antireflective layer having an optical constant of n-i$\kappa$ and a thickness d of 8.193/$\kappa$ [nm] on an underlying substrate for a semiconductor device to be fabricated, and for forming a resist film on the bottom antireflective layer, the method comprising: using a light source emitting rays of light having a wavelength of 157 nm, and a resist film containing a fluorine containing resin or siloxane resin; and selecting an intensity reflectance R on the interface between the resist film and the antireflective layer so as to meet the following expression assuming that an optical constant of the resist film is n'-i$\kappa'$.

$$0.56+13042\times(\kappa')^{2.14} \geq R \geq 0.07+16833\times(\kappa')^{3.21}$$

DETAILED DESCRIPTION OF THE INVENTION

Referring now to the accompanying drawings, some embodiments of the present invention, together with their examples, will be described below. In each of the following embodiments, a shading type bottom antireflective layer is used as a bottom antireflective layer.

(1) First Embodiment

Figure 1:
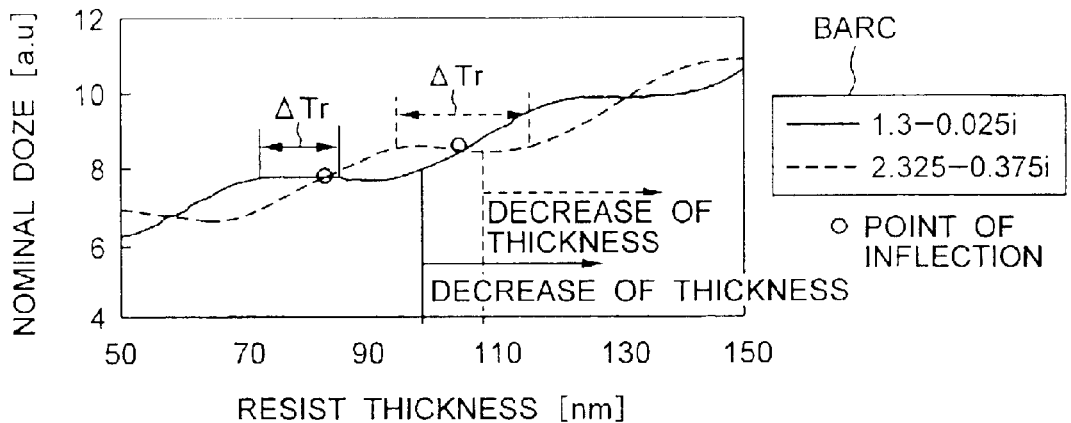
FIG. 1 is a graph showing the relationship between the variation of resist thickness and the variation of nominal dose when an bottom antireflective layer having an optical constant determined by a first embodiment of the present invention is used.

FIG. 1 shows the variation of nominal dose due to the variation of resist thickness on the antireflective layer having an optical constant suitable for a bottom antireflective layer by a determining method in this embodiment. According to this embodiment, it is possible to suppress the variation of nominal dose only around a point of inflection at which a tertiary derived function is positive (around a point of inflection existing between both poles if the maximum and minimum points exist), on an nominal dose curve capable of being described by the sum of a monotonic increase term and a damped oscillation term.

An electric field E at an optional point in a resist film due to the variation of the resist thickness can be mathematically described. Since an expression considering an optical system of an exposure system is very complicated, a case where (1) a vertical incidence occurs and (2) a bottom antireflective layer is sufficiently thick (the reflection on the interface between a bottom antireflective layer and an underlying substrate can be ignored) will be described for simple description.

$$E(Tr, z) = \frac{\left\{1 + \tilde{r}_s \exp\left(-i\frac{4\pi}{\lambda}\tilde{n}'z\right)\right\} \times \exp\left\{-i\frac{2\pi}{\lambda}\tilde{n}'(Tr-z)\right\}}{1 - \tilde{r}_s \tilde{r}'_a \times \exp\left(-i\frac{4\pi}{\lambda}\tilde{n}'Tr\right)} \quad (2)$$

$$\tilde{r}_s = \frac{\tilde{n}' - \tilde{n}}{\tilde{n}' + \tilde{n}} \quad \tilde{r}'_a = \frac{\tilde{n}' - (1.0 - i0.0)}{\tilde{n}' + (1.0 - i0.0)}$$

In the above expression, the optical constant of the resist is ñ'=n'–iκ', the optical constant of the underlying substrate is ñ=n–iκ, and $\tilde{r}_s$ denotes an amplitude reflectance on the interface between a resist film and an bottom antireflective layer, $\tilde{r}_a$' denoting an amplitude reflectance on the interface between the resist film and air (atmosphere in exposure system), Tr denoting the thickness of the resist film, and z denoting a distance from the interface of the bottom antireflective layer in the resist film.

A quantity of absorbed light I (Tr, z) in the resist film is a real part of square of E (Tr, z).

$$I(Tr,z) = Re|E(Tr,z)^2| \quad (3)$$

It is assumed that the inverse number of I (Tr, z) at a noticed position z for the measurement of dimension is a nominal dose Eop(Tr).

This nominal dose Eop(Tr) is generally an oscillation function, and shows a tendency to increase when the extinction coefficient κ' of the resist film is not 0. At this time, the expression can be simplified to be described as follows.

$$Eop(Tr) = A \times \exp(B \times Tr) + C \times \exp(-D \times Tr) \times \sin\left(\frac{2\pi}{F}(Tr - E)\right) \quad (4)$$

However, among variables A through F, A and C are real numbers of more than 0, and B and D through F are positive numbers.

Figure 2:
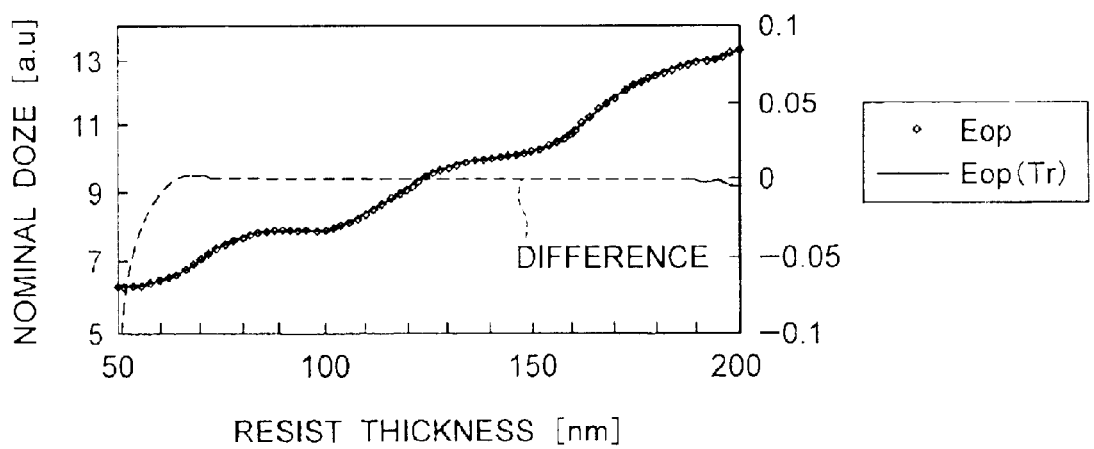
FIG. 2 is a graph showing that a nominal dose Eop(Tr) with respect to the resist thickness can be approximated by expression (4)

Thus, the nominal dose Eop(Tr) with respect to the resist thickness can be precisely approximated as shown in FIG. 2 by the expression (4) comprising a monotonic increase term and a damped oscillation term with respect to the thickness.

In the expression (4), if the extinction coefficient of the bottom antireflective layer is changed, i.e., if the reflectance on the interface between the resist film and the bottom antireflective layer is changed, the amplitude of the vibration component varies. If the slope at the point of inflection between the maximum and minimum points of the damped oscillation term cancels the slope of the monotonic increase term, the variation of nominal dose with respect to the thickness of the film becomes 0 in the vicinity of the point of inflection of the damped oscillation term as shown in FIG. 1. The period of the damped oscillation term is originated from the thin film interference effect in the resist film. If the difference between the maximum and minimum values is 0 or an allowable variation of light exposure or less with respect to the point of inflection between the maximum and minimum points of the nominal dose, the variation of resist thickness between the maximum and minimum points is at least allowable. At a result, it is possible to obtain an allowable range of the resist thickness, which is equal to or wider than that of 248 nm light. Thus, it is possible to greatly suppress the deterioration of performance of a semiconductor device due to the instability of process including the topography of the underlying substrate and the variation of thickness caused by the resist coating.

The thickness of the resist film in the vicinity of the point of inflection suppressing the variation in nominal dose varies in accordance with the optical constant of the bottom antireflective layer. For example, as two examples shown by solid and broken lines in FIG. 1, the thickness of the resist film in the vicinity of the point of inflection, at which the variation in nominal dose is suppressed, varies in dependence upon difference in optical constants of the two antireflective layers. In the above described prior art, it can be determined that only one example of the two examples in FIG. 1 is suitable for an antireflective layer only when the range of thickness of the resist film varied by calculation is sufficiently narrow. In order for the prior invention to obtain the same effects as those in this embodiment, it is required to divide the optical constant of the bottom antireflective layer into a plurality of regions to change the thickness of the resist film which is used for calculation for every divided region. However, the above described prior art fails to disclose such descriptions.

Thus, according to this embodiment, it is possible to determine an optical constant of an bottom antireflective layer suitable for 157 nm light with respect to the inhibition of the variation in thickness even in the case of a resist film having a low transparency, although it is difficult for the above described prior art to carry out such determination.

Since it is possible to obtain an allowable range of thickness of a resist film, which is the same as or wider than that of 248 nm light, with respect to 157 nm light by using an bottom antireflective layer having an optical constant obtained in the above described embodiment, it is possible to greatly suppress the deterioration of performance of a semiconductor device due to the instability of process, such as the topography of the underlying substrate or the variation of resist thickness as coating, by forming a resist pattern using such an bottom antireflective layer.

In the above described method for determining the optical constant of the bottom antireflective layer, it has been described that the thickness of the bottom antireflective layer is sufficiently thick to such an extent that it is possible to ignore the reflection on the interface between the bottom antireflective layer and the underlying substrate, and specific numerical values will be described below.

The bottom antireflective layer can be generally divided into two kinds of thin film interference and shading types on the basis of the reflection reducing function thereof. Most of organic antireflective layers used for 248 nm light and so forth are thin film interference type layers. As the summary thereof, the amplitude of the standing waves in the resist film is suppressed by the phase difference between incident light, reflected light on the interface between the resist film and the bottom antireflective layer, and reflected light on the interface between the bottom antireflective layer and the underlying substrate. Since the reflected light on the interface between the bottom antireflective layer and the underlying substrate concerns, the suppression of the thin film interference effect is insufficient when the material of the uppermost layer of the underlying substrate is different, when the uppermost layer is transparent and the thickness thereof is different in plane, or when the thickness of the bottom antireflective layer varies due to topography of the underlying substrate.

On the other hand, in the case of the shading type bottom antireflective layer, a bottom antireflective layer having such a thickness that the bottom antireflective layer itself has a sufficient absorbing power is used for damping reflected light from the interface between the bottom antireflective layer and the underlying substrate to substantially zero. Thus, the thin film interference effect in the thickness of the resist film only depends on illumination conditions, optical constants of the resist film and bottom antireflective layer, and the resist thickness.

As a standard that the bottom antireflective layer has a sufficient absorbing power, the intensity of light which is reflected on the interface between the bottom antireflective layer and the underlying substrate and which is incident on the resist film again is sufficient to be different by two digits from the intensity of reflected light on the interface between the resist film and the bottom antireflective layer. The reflected light on the interface between the bottom antireflective layer and the underlying substrate passes through the bottom antireflective layer having a thickness of d twice. In addition, as will be described later, according to the present invention, the reflectance on the interface between the resist film and the bottom antireflective layer is preferably about 10% or less. If the amplitude transmittance and amplitude reflectance on each interface is approximated to 1, the following relationship is established with respect to an absorbance $\alpha'$.

$$0.1 \times 10^{-2} \geq 10^{-\alpha' 2d} \tag{5}$$

Assuming that the extinction coefficient of the bottom antireflective layer is $\kappa$ with respect to the exposure wavelength $\lambda=157$ nm, the required thickness d of the bottom antireflective layer is obtained by the following expression.

$$d \geq \frac{3\lambda \log_{10}(\exp)}{8\pi\kappa} \simeq \frac{8.193}{\kappa} \tag{6}$$

EXAMPLE 1

An nominal dose of 70 nm L/S was calculated on optical conditions that wavelength $\lambda=157$ nm, numerical aperture NA=0.80, illumination coherency $\sigma=0.85$, shielding rate $\epsilon=0.67$, and transmittance of half-tone mask t=6%. The optical constant of the resist film was set to be 1.7–0.06i.

Figure 3:
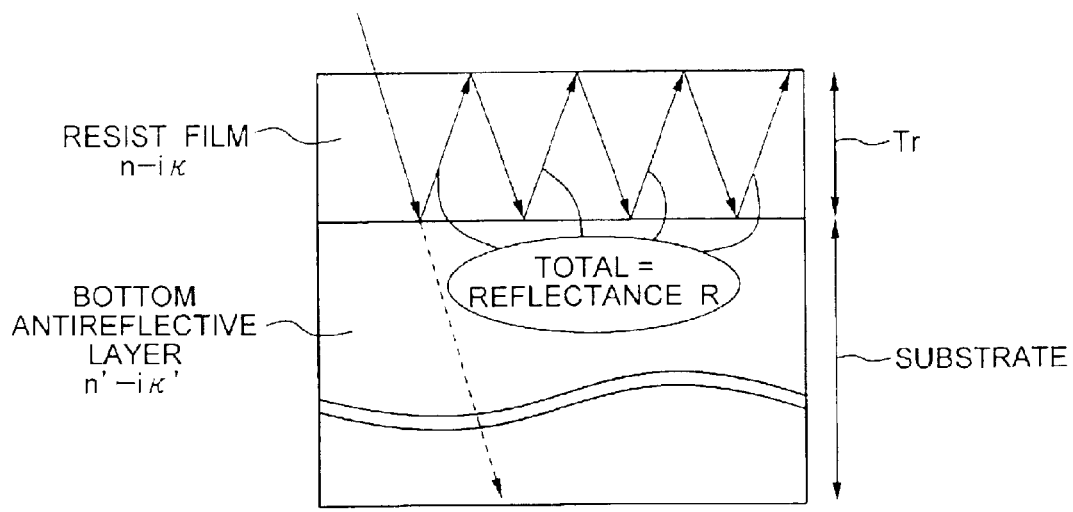
FIG. 3 is a schematic diagram showing the structure of a bottom antireflective layer and a resist film formed thereon, as a premise of calculation of a nominal dose.

It was assumed that the bottom antireflective layer has a thickness sufficient for ignoring the thickness and kind of the underlying substrate, i.e., reflected light on the interface between the bottom antireflective layer and the underlying substrate can be ignored. In order to shorten calculation time, the structure of the bottom antireflective layer was approximated to the structure of the resist on the bottom antireflective layer having an infinite thickness as shown in FIG. 3. From the space image on the above described optical conditions, an electric field distribution E (Tr, x, z) in a resist film having a thickness of Tr was calculated. The (x, z) represents a notice position in the resist film. The real part Re (E (Tr, x, z)$^2$) of square of the intensity of the electric field is the quantity of absorbed light I (x, z) in the standardized resist film at the noticed position. It was assumed that the inverse number of the quantity of absorbed light is a standardized nominal dose Eop.

$$Eop(Tr)=1/I(Tr,x,z)=1/Re(E(Tr,x,z)^2) \quad (3')$$

In this case, the nominal dose Eop having a line width of 70 nm at a height z=10 nm from the bottom antireflective layer was obtained. The same procedure was carried out at intervals of 2.5 nm from the thickness of the resist film Tr=50 nm to 200 nm, so that a curve Eop(Tr) of an nominal dose depending on the thickness of the resist film at an optical constant n-iκ was obtained.

With respect to the nominal dose variation curve Eop(Tr) of expression (3'), variables A, B, C, D, E and F of expression (4) were determinedly the parameter fitting. With respect to the above described nominal dose variation curve on which the parameters have been determined, the variation range (ΔTr) of the resist thickness wherein the variation range ΔEop of the Eop was 1% was calculated. The vibration period F of the nominal dose Eop(Tr) is a value approximating to the period 157/(2×1.74)≈45.1 nm of the standing waves in the resist film.

When both of the optical constants of the resist and bottom antireflective layer are 1.74–0.06i (the reflection on the interface between the resist film and bottom antireflective layer is 0), the thickness of the resist film decreases on the above described optical conditions when the thickness of the resist film is 100 nm or more.

Figure 4:
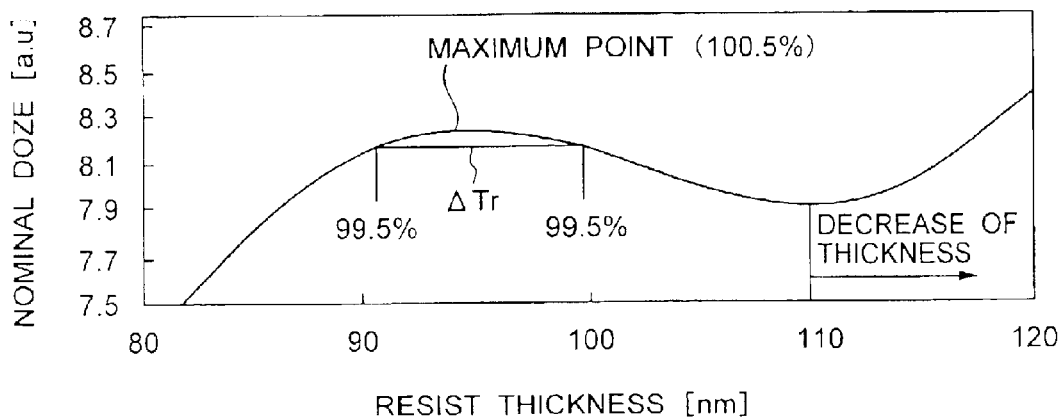
FIG. 4 is a graph for explaining a method for acquiring the variation of the resist thickness $\Delta Tr$ which is wider in the vicinity of the maximum point.
Figure 5:
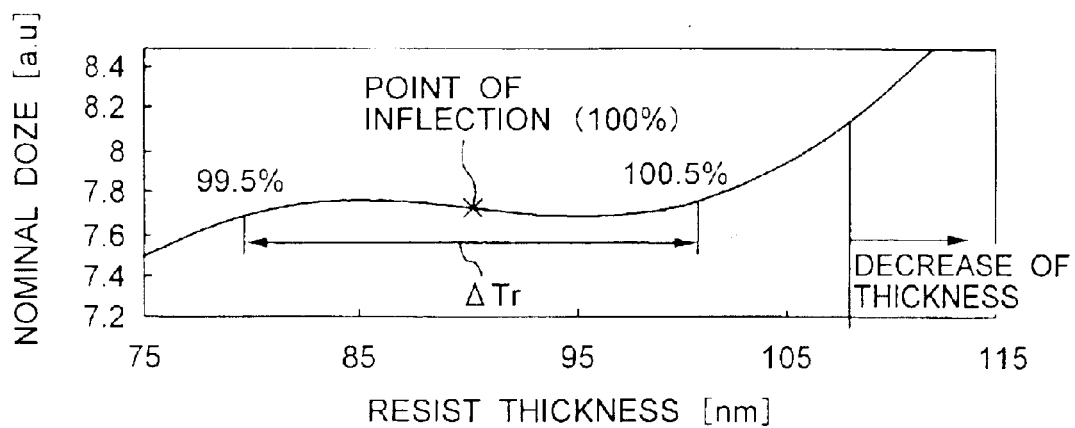
FIG. 5 is a graph for explaining a method for acquiring the variation of the resist thickness $\Delta Tr$ which is wider in the vicinity of the point of inflection.
Figure 23:
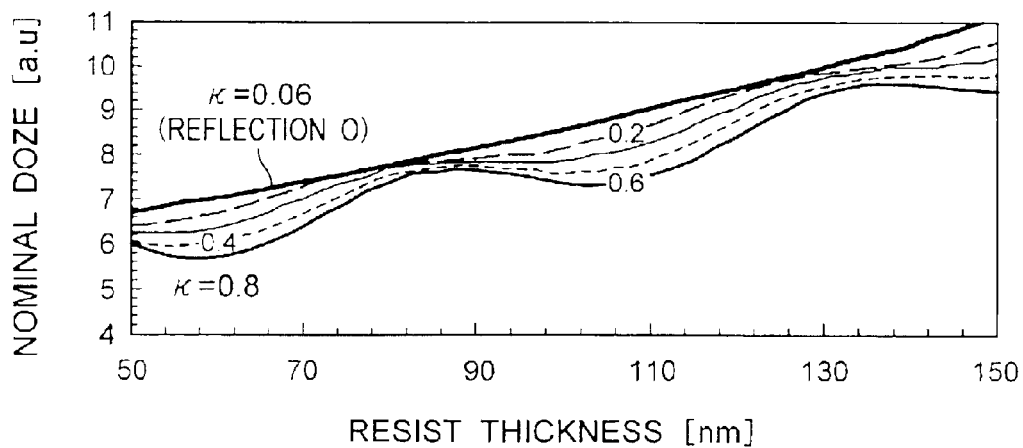
FIG. 23 is a graph showing an example of the variation in nominal dose due to the variation of resist thickness when the resist film having a low transparency is exposed to 157 nm light, in the prior art.

It was assumed that the thickness of the resist film serving as a standard of ΔEop was the maximum point (dEop/dTr=0, d$^2$(Eop)/(dTr)$^2$<0) which is nearest to 100 nm, or the point of inflection (d$^2$(Eop)/(dTr)$^2$=0, d$^3$(Eop)/(dTr)$^3$>0) between the maximum and minimum values. The values of ΔTr at the maximum point and at the point of inflection were obtained, and a larger value was adopted. In the vicinity of the maximum point, a range of (100%–0.5%)/(100%+0.5%)×100% was obtained with respect to the maximum value of the nominal dose Eop as shown in FIG. 4. In the vicinity of the point of inflection, a difference in thickness of the resist film between 99.5% and 100.5% closing to the point of inflection is obtained as shown in FIG. 5. As can be clearly seen from expression (4), the above described maximum point does not exist in the case of a certain optical constant of the bottom antireflective layer such as a case where the optical constant of the bottom antireflective layer shown in FIG. 23 is 1.74–0.2i. In such a case, only ΔTr in the vicinity of the point of inflection was calculated.

The same procedure was carried out by changing the optical constant of the bottom antireflective layer. From the result, an optical constant having large ΔTr suitable for the bottom antireflective layer was selected.

Figure 6:
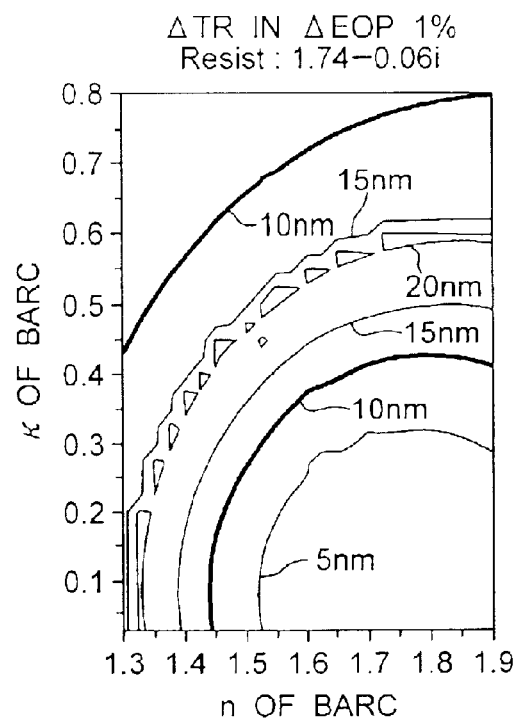
FIG. 6 is a graph showing a distribution of the variation of resist thickness $\Delta Tr$ which gives a variation range of allowable nominal dose $\Delta Eop=1\%$ in a first example according to the present invention.

Regarding the optical constant of the bottom antireflective layer and with respect to a range of a refractive index n=0.025–1.9 and an extinction coefficient κ=0.25–0.80, calculation was carried out at intervals of 0.025 of n and κ. The results of this calculation are shown in FIG. 6 wherein the abscissa axis denotes a refractive index n of the bottom antireflective layer, and the ordinate axis denotes an extinction coefficient κ. As shown in this figure, the thickness ΔTr of the resist film giving a 1% variation range of the nominal dose shows a concentric circular distribution, and a large thickness of 15 nm or more can be obtained in an appropriate region. Furthermore, a line formed by connecting values at which the thickness of the film of 20 nm or more is obtained in the figure (which will be simply hereinafter referred to as a contour line) is interrupted by a plurality of peaks. This is caused by the calculation carried out with respect to the optical constant of the bottom antireflective layer at regular intervals, and the approximation of a graph preparing software. If the above described density of calculation of the optical constant is increased, a smooth distribution can be obtained.

While calculation has been carried out by the nominal dose (the inverse number of the quantity of absorbed light) in the resist film in this embodiment, calculation may be carried out by the quantity of absorbed light. In that case, the pattern fitting can be carried out in the form of expression (4), but B is a negative number.

(2) Second Embodiment

It is not realistic that the optical constant described in the first embodiment is determined by experiments while changing the kind of the antireflective layer, and it is effective that the optical constant is determined by calculation.

In order to calculate the nominal dose of the resist pattern, it is required to calculate the shape of the resist pattern. Even if the calculation of the shape of the resist pattern is relatively simple, it is required to carry out ① a step of calculating a spatial image of a desired pattern, ② a step of calculating the intensity of an electric field in a resist film, ③ a step of calculating the concentration of an acid produced by an optical acid producing agent, ④ a step of calculating the diffusion of the acid and the elimination reaction of a solution inhibiting group, and ⑤ a step of calculating development according to the solution inhibiting group.

The calculation time required to carry out the calculation steps ④ and ⑤ of these steps increases as precision is improved. At the calculation steps ③ through ⑤, it is required to use parameters indicative of characteristics of the resist, such as acid producing efficiency (③), the diffusion/de-protection reaction at PEB step (④) and the developing step (⑤). However, in order to calculate the nominal dose due to the optical constant of the bottom antireflective layer, the influence of the optical constant and thickness of the resist and bottom antireflective layer is greatest.

From this standpoint, the intensity of an electric field (the intensity of a first electric field) in the resist film may be used as an initial value for calculating diffusion, and the intensity of an electric field (the intensity of a second electric field) giving a desired pattern dimension may be derived from the result of calculation of diffusion to be adopted as a threshold. This threshold varies in accordance with the thickness of the resist film and the optical constant of the bottom antireflective layer. The inverse number of the threshold corresponds to a threshold of light exposure.

Therefore, the calculation of the intensity of the electric field in the resist film (①,②) corresponds to such an approximation that the amount of produced acid is in proportion to the intensity of the electric field (③), the diffusion constant of the acid is constant and the elimination of the solution inhibiting group is in proportion to the final density of the acid (④) and the dissolution contrast is infinite and the dissolution speed of the fine light exposure is 0.

According to this embodiment, it is possible to shorten the calculation time by using such an approximation.

EXAMPLE 2

Although the optical conditions (λ157 nm, numerical aperture NA=0.80, illumination coherency σ=0.85, shielding rate ε=0.67, transmittance of half-tone mask t=6%, 70 nm L/S) and the optical constant of the resist film (1.7−0.06i) were the same as those in Example 1, a part of the method was changed for calculating the optimum optical constant of the bottom antireflective layer.

The quantity of absorbed light in Example 1 was used as an initial value for carrying out a diffusion calculation by the Fick law. At this time, it was considered that the diffusion constant D [nm2/sec] was constant, and it was assumed that the mean diffusion length $L=(2Dt)^{1/2}=40\times(2)^{1/2}$[nm] at the PEB time. In the distribution of the quantity of absorbed light after diffusion, the inverse number of the quantity of absorbed light having a line dimension of 70 nm at z=10 was regarded as the nominal dose. Because it is considered that the acid producing efficiency from the PAG is in proportion to the quantity of absorbed light in the resist film and that the de-protection rate corresponds to the final quantity of the acid after diffusion.

A contour line in the resist film due to the quantity of absorbed light having the line dimension of 70 nm is acquired, and this is regarded as the shape of the cross section of the resist pattern. The thickness Tr of the resist was compared with the maximum thickness of the resist pattern.

The maximum and inflection points of the curve of the nominal dose Eop(Tr) in Example 1 were selected in a range where the thickness Tr of the resist film was 50 nm or more and where the maximum thickness of the resist pattern was equal to or smaller than the resist thickness Tr, i.e., the thickness of the resist pattern does not decrease form the thickness as coated.

As the optical constants of the bottom antireflective layer, a refractive index of 1.30–2.50 and an extinction coefficient of 0.25–0.80 were selected. With respect to these ranges, both of the refractive index and extinction coefficient were calculated at intervals of 0.25.

Figure 7:
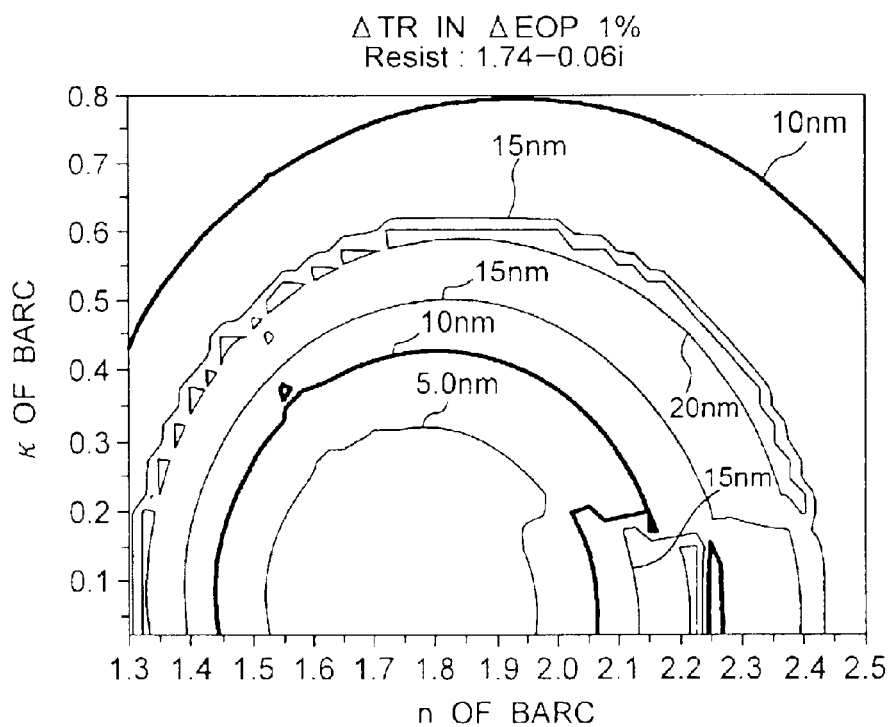
FIG. 7 is a graph showing a distribution of the variation of the resist thickness $\Delta Tr$ which gives an allowable variation range of nominal dose $\Delta Eop=1\%$ in a second example according to the present invention.

The variation of ΔTr at ΔEop=1% on the above described conditions is shown in the graph of FIG. 7. In this figure, the contour lines of ΔTr in a region of n≧1.9 and k≦0.2 of the concentrically distributed contour lines of ΔTr are bent so as to enter a circle. It is considered that this is caused by selecting the maximum point or the inflection point on the side of the thin film by one period with respect to the ΔEop(Tr) in the above described region by changing the phase of the electric field in the resist film by the optical constant of the bottom antireflective layer and by changing the thickness of the resist film which does not greatly decrease.

Figure 8:
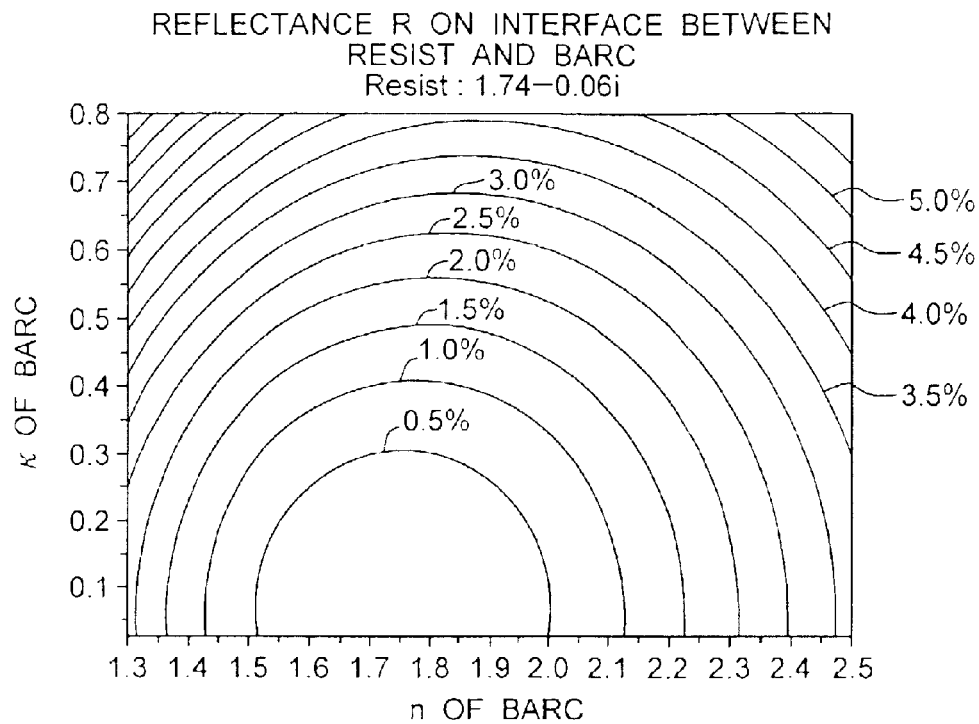
FIG. 8 is a graph showing the results of calculation of a reflectance R on the interface between a resist film and a bottom antireflective layer in the second example according to the present invention.

The results of calculation of a reflectance R on the interface between the resist film and the bottom antireflective layer in the above described optical conditions and structure of the film are shown in FIG. 8.

From the overlapping region of FIG. 7 with FIG. 8, it can be seen that the optical constants of the optimum bottom antireflective layer having ΔTr≧15 nm are arranged in a region between inner $R_{inner}$=1.3–1.9% and outer $R_{outer}$= 2.1–2.7% if it is considered that the optical constant 1.74–0.06i of the resist film is a standard of the concentric circle in the concentric distribution of the reflectance R. It can also be seen that a desired optical constant of the bottom antireflective layer giving desired ΔTr≧10 nm is arranged in a region between inner $R_{inner}$=0.9–1.2% and outer $R_{outer}$= 3.6–4.4%.

In order to shorten the calculation time in the prediction of the shape of the resist pattern in this embodiment, the diffusion calculation of the distribution of the intensity of the electric field was carried out by the difference calculus. In place of the difference equation, it may be carried out by another calculation technique, such as Gauss convolution integral of an electric field intensity distribution, which means the diffusion of an acid. In order to more precisely predict the shape of a chemical amplitude type resist, the diffusion and reaction of an acid and a base and the reaction of an acid with a solution inhibiting group may be considered for carrying out calculation although this does not have the merit of shortening the calculation time.

Comparative Example 1

In the Case of KrF Light

Using the same method as that in Example 2, calculation was carried out in a case where KrF light(λ=248 nm), numerical aperture NA=0.68, illumination coherency σ=0.75, shielding rate ε=0.67, transmittance of half-tone mask t=6%, and 130 nmL/S.

The construction of the film was carried out on the following conditions. That is, the optical constant of the resist film is 1.76–0.01i (absorption coefficient α'=4 π×0.01×$\log_{10}$(exp)/(2×1.76)≈0.22 $\mu m^{-1}$), and the optical coefficient of the bottom antireflective layer is 1.48–0.51i (the measured value of AR3 produced by Siplay Company), the thickness being 60 nm, the underlying substrate being made of poly-Si(optical constant 1.60–3.61i). On these conditions, the reflectance on the interface between the resist film and the bottom antireflective layer (AR3 film) is 0.4%, and excellent reflection reducing effects are provided.

According to studies separately carried out by the inventors, the allowable variation range ΔEop of the nominal dose due to the variation in thickness of the resist film on the above described optical conditions is 1.5%. The variation range ΔTr of the thickness of the resist film at ΔEop= 1.5% was obtained.

With respect to the optical constant of the above described resift film, the same calculation was simultaneously carried out when the reflection on the interface between the resist film and the bottom antireflective layer is 0 At this time, the thickness of the resist film serving as a standard for the calculation of the variation range ΔEop of the allowable nominal dose was set to be 345 nm which was the maximum point of the nominal dose at 60 nm of the AR3 film.

At 60 nm of the AR3 film, the variation range of the thickness of the resist film was ΔTr≈15.8 nm in the variation range of the allowable nominal dose ΔEop=1.5%. If the reflection is 0, the variation range of the resist thickness ΔTr=28 nm, which teaches that the reflectance preferably approaches zero if the transparency of the resist film is very high.

If the variation range of the allowable nominal dose ΔEop=1%, the variation range of the resist thickness is ΔTr=12.8 nm on AR3, and if the reflectance is zero, the variation range of the resist thickness is ΔTr=19.0 nm. If the variation range of the allowable nominal dose ΔEop is narrowed, the allowable variation range of the resist thickness ΔTr also decreased.

Comparative Example 2

In the Case of 157 nm Light

Figure 9:
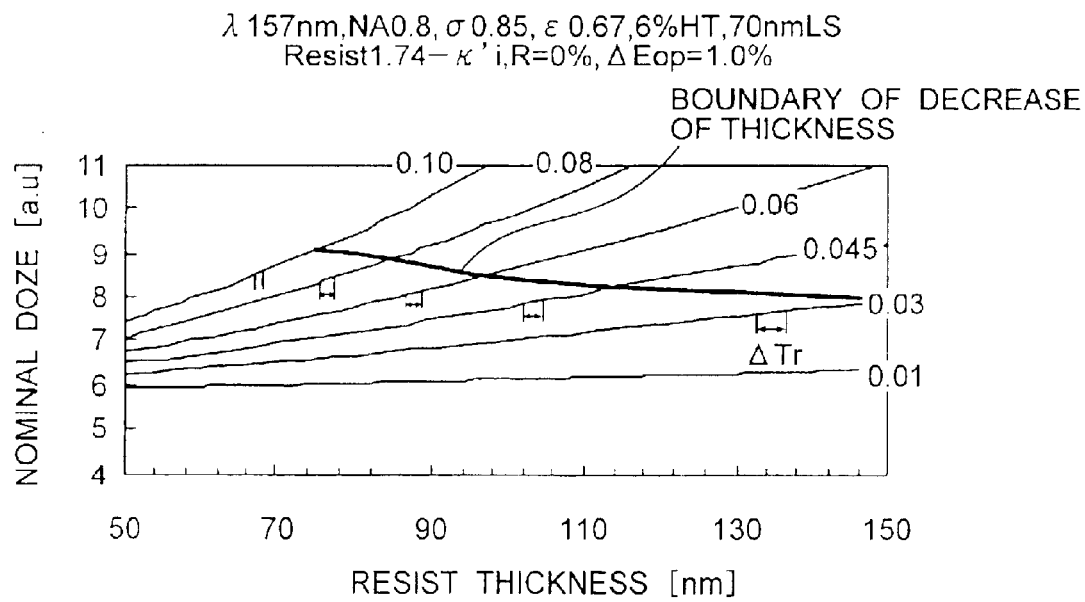
FIG. 9 is a graph showing a distribution of the variation of the resist thickness $\Delta Tr$ which gives a variation range of allowable nominal dose $\Delta Eop=1\%$ in a second comparative example in the second embodiment of the present invention.

Using the same optical conditions and film construction as those in Example 2, in a plurality cases where the refractive indexes of the resist film were commonly n'=1.74 and the extinction coefficients κ' were different, the variation range of the thickness of the resist film ΔTr in the variation range of the allowable nominal dose $\Delta \text{Eop}=1\%$ was obtained when the reflection on the interface between the resist film and the bottom antireflective layer was 0. The results of calculation are shown in the graph of FIG. 9. As shown in FIG. 9, on the side where the thickness of the resist film more greatly increases than that on the thickness decreasing interface, the thickness of the resist pattern decreases. The method for calculating the presence of the decrease of the thickness is identical as the method described in Example 2.

The variation range of the resist $\Delta \text{Tr}$ in the variation range of the allowable nominal dose $\Delta \text{Eop}=1\%$ decreases as the extinction coefficient $\kappa'$ of the resist film increases. If the extinction coefficient $\kappa'$ is equal to or more than 0.03, $\Delta \text{Tr}$ in $\Delta \text{Eop}=1\%$ is only 2 to 1 nm.

Unlike the case of KrF light where the resist film has a high transparency and which is described in Comparative Example 1, if the reflection on the interface between the resist film and the bottom antireflective layer is set to be 0, $\Delta \text{Tr}$ is far smaller than that in the method described in Example 1. Thus, if the transparency of the resist film is low, it can be seen that it is not advantageous that the reflection on the interface is set to be 0.

EXAMPLE 3

The same calculation as that in Example 2 was carried out when the complex index of refraction of the resist film was 1.74–0.045i.

Figure 10:
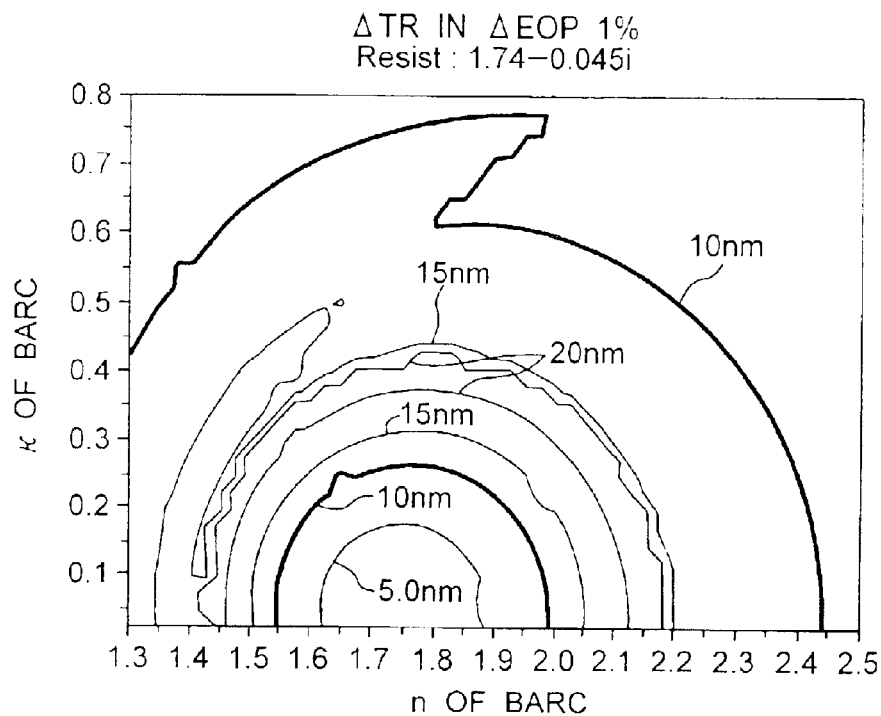
FIG. 10 is a graph showing a distribution of the variation of the resist thickness ΔTr which gives a variation range of allowable nominal dose ΔEop=1% in a third example according to the present invention.
Figure 11:
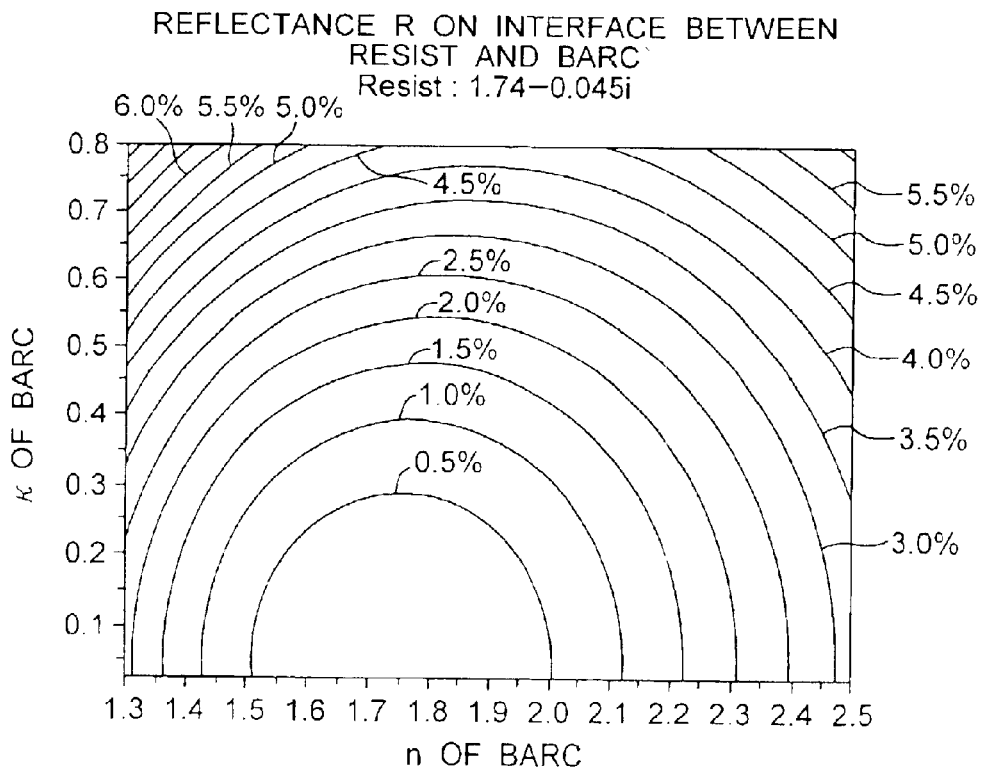
FIG. 11 is a graph showing the results of calculation of a mean intensity reflectance R on the interface between a resist film and a bottom antireflective layer in the third example according to the present invention.

The distribution of the variation range of the resist thickness $\Delta \text{Tr}$ in the variation range of the allowable nominal dose $\Delta \text{Eop}=1\%$ is shown in FIG. 10, and the mean intensity reflectance R on the interface between the resist film and the bottom antireflective layer is shown in FIG. 11.

Similar to Example 2, from the overlapping region of FIG. 10 with FIG. 11, it can be seen that the optical constants of the optimum bottom antireflective layer having the variation range of the resist thickness $\Delta \text{Tr} \geq 15$ nm are arranged in a region between inner $R_{inner}=0.55-0.7\%$ and outer $R_{outer}=1-1.5\%$ if it is considered that the optical constant 1.74–0.045i of the resist film is a standard of the concentric circle in the concentric distribution of the reflectance R. It can also be seen that a desired optical constant of the bottom antireflective layer having a preferable variation range of the resist thickness $\Delta \text{Tr} \geq 10$ nm is arranged in a region between inner $R_{inner}=0.4-0.45\%$ and outer $R_{outer}=2.5-2.8\%$.

EXAMPLE 4

The same calculation as that in Example 2 was carried out when the complex index of refraction of the resist film was 1.74–0.03i.

Figure 12:
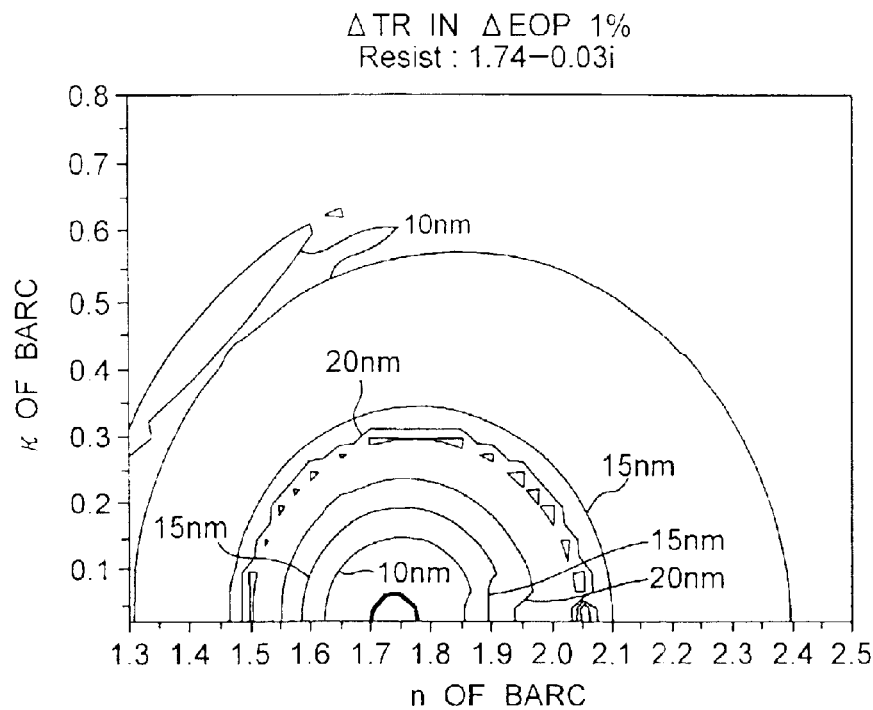
FIG. 12 is a graph showing a distribution of the variation of the resist thickness ΔTr which gives a variation range of allowable nominal dose ΔEop=1% in a fourth example according to the present invention.
Figure 13:
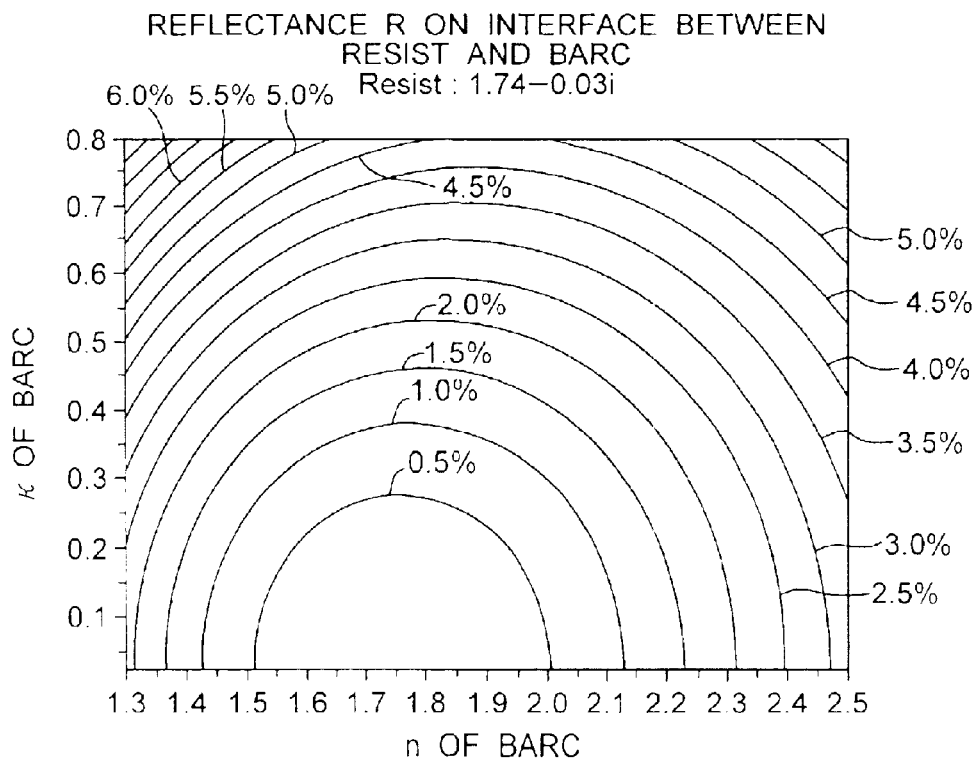
FIG. 13 is a graph showing the results of calculation of a mean intensity reflectance R on the interface between a resist film and a bottom antireflective layer in the fourth example according to the present invention.

The variation range of resist thickness $\Delta \text{Tr}$ in the variable range of the allowable nominal dose $\Delta \text{Eop}=1\%$ is shown in FIG. 12, and the mean intensity reflectance on the interface between the resist film and the bottom antireflective layer is shown in FIG. 13.

From the overlapping region of FIG. 12 with FIG. 13, it can be seen that the optical constants of the optimum bottom antireflective layer having the variation range of the resist thickness $\Delta \text{Tr} \geq 15$ nm are arranged in a region between inner $R_{inner}=0.2\%$ and outer $R_{outer}=0.75-0.9\%$ if it is considered that the optical constant 1.74–0.03i of the resist film is a standard of the concentric circle in the concentric distribution of the reflectance R. It can also be seen that a desired optical constant of the bottom antireflective layer having a preferable variation range of the resist thickness $\Delta \text{Tr} \geq 10$ nm is arranged in a region between inner $R_{inner}=0.12-0.14\%$ and outer $R_{outer}=2.1-2.5\%$.

(3) Third Embodiment

By using the results in the above described Examples 2 through 4, it is possible to obtain a correlation between the range of the variation range of the resist thickness $\Delta \text{Tr} \geq 10$ nm in the variation range of the allowable nominal dose $\Delta \text{Eop}=1\%$ and the reflectance R on the interface between the resist film and the bottom antireflective layer, when the optical constant of the resist film is $n'-i\kappa'$ and the extinction K' is changed. The results of the calculation are shown in FIG. 14.

Figure 14:
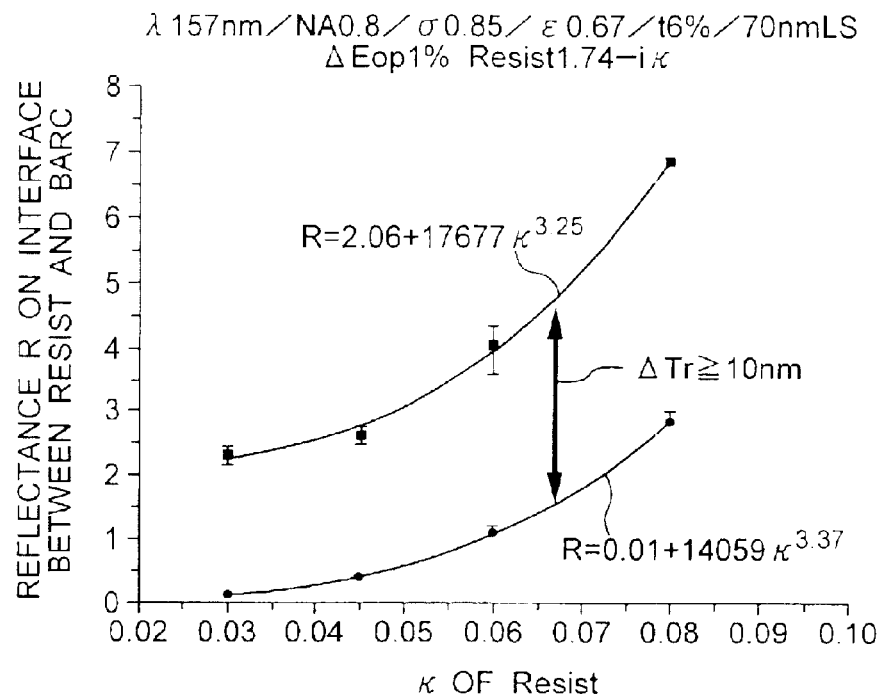
FIG. 14 is a graph showing a correlation between a range, in which a variation range of resist thickness ΔTr≧10 nm in a variation range of allowable nominal dose ΔEop=1%, and a reflectance R on the interface between the resist film and an bottom antireflective layer in the third embodiment of the present invention.

It can be seen from FIG. 14 that there is the following correlation between the above described interface intensity reflectance R and the extinction $\kappa'$ (optical constant n'-i K') of the resist film.

$$2.06+17677\times(\kappa')^{3.25} \geq R \geq 0.01+14059\times(\kappa')^{3.37}$$

(4) Fourth Embodiment

When a material having a strong absorbance is used for forming a resist film, if it is a positive resist, a formed line pattern has a strong tapered shape.

Since the resist film is an etching mask for an underlying film, it is desired from the processing precision and the management of dimension that the side wall of the resist pattern is perpendicular to the surface of the underlying film as far as possible while having the tapered cross section.

In actual resist materials, it is possible to change the angle of the side wall of the pattern to a certain extent from the optical resist shape calculated from the intensity of the electric field and the quantity of absorbed light, in accordance with the dependence of the concentration of additives, i.e., PAG, acid-quencher and materials having the solution suppressing effect, in the direction of the thickness. However, as the optically determined shape of the resist approaches a desired shape, the adjustment of the shape due to the composition is easy, and the options of methods are increased, so that it is possible to obtain a resist film having a desired rectangular cross section without deteriorating other important characteristics, such as exposure margin and resolution. The angle of the side wall of the resist pattern is a selection criterion for determining a desired bottom antireflective layer since it shows a different distribution from the intensity reflectance.

From the standpoint of the difference in conversion of processing due to the density of the pattern, which was separately carried out by the inventors, there were obtained the results that the desirable angle of the wide wall of the pattern lay in the range from 80° to 90° in a positive resist.

On the other hand, in a resist for the same wavelength, which was exposed to KrF (248 nm) light, there was a resist obtaining the results of experiments that the angle of the side wall was 89.5° which was predicted to be 85° by the same illumination conditions and film stack as Comparative Example 1. On the analogy of this result, it is considered that the side wall angle of about 5° can be adjusted by the composition of the resist.

In view of the foregoing, if the result of calculation of the side wall of the resist pattern is in the range from 75° to 95°, it is considered that it is possible to obtain a desired pattern side wall angle of 80° to 90° on the processing by adjusting the composition of the resist.

EXAMPLE 6

Figure 15:
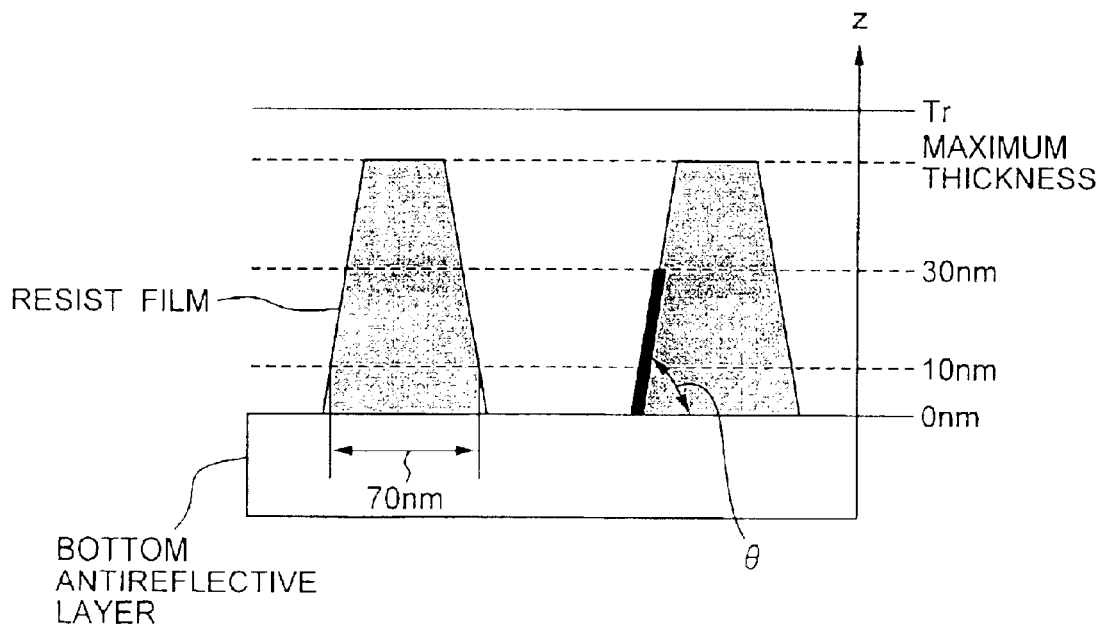
FIG. 15 is a schematic diagram for explaining the definition of a pattern side-wall angle θ of a resist pattern in the third embodiment of the present invention.

In the shape of the resist pattern based on the resist film in Example 2, the pattern side wall angle $\theta$ was defined from positions of heights 0 nm and 30 nm from the interface between the resist film and the bottom antireflective layer as shown in FIG. 15.

Figure 16:
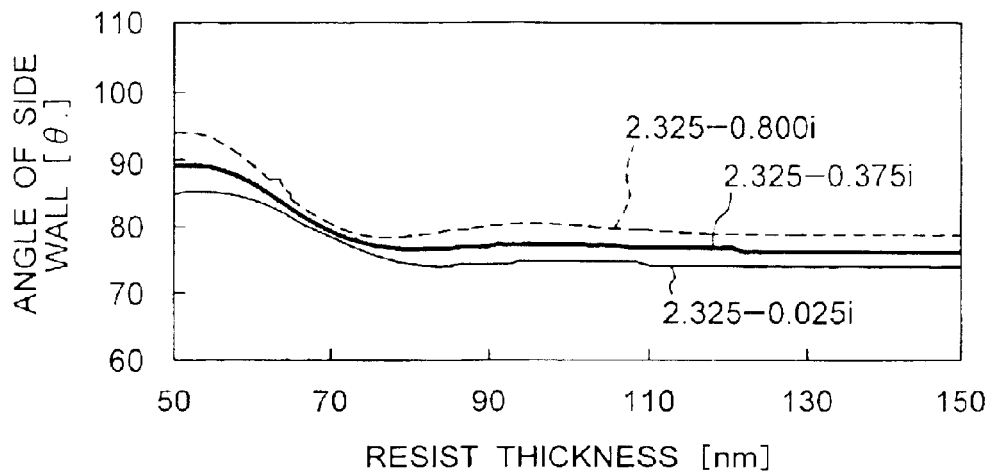
FIG. 16 is a graph showing an example where a side-wall angle θ varies in accordance with the variation in thickness Tr of a resist film.

An example where the side wall angle θ varies in accordance with the variation in resist thickness Tr is shown in FIG. 16. When the resist thickness is about 70 nm or more, the side wall angle θ hardly varies. It was assumed that a side wall angle in the thickness described in Example 2, wherein the thickness of the resist pattern did not decrease, was a side wall angle in the optical constant of the bottom antireflective layer based on the calculation.

Figure 17:
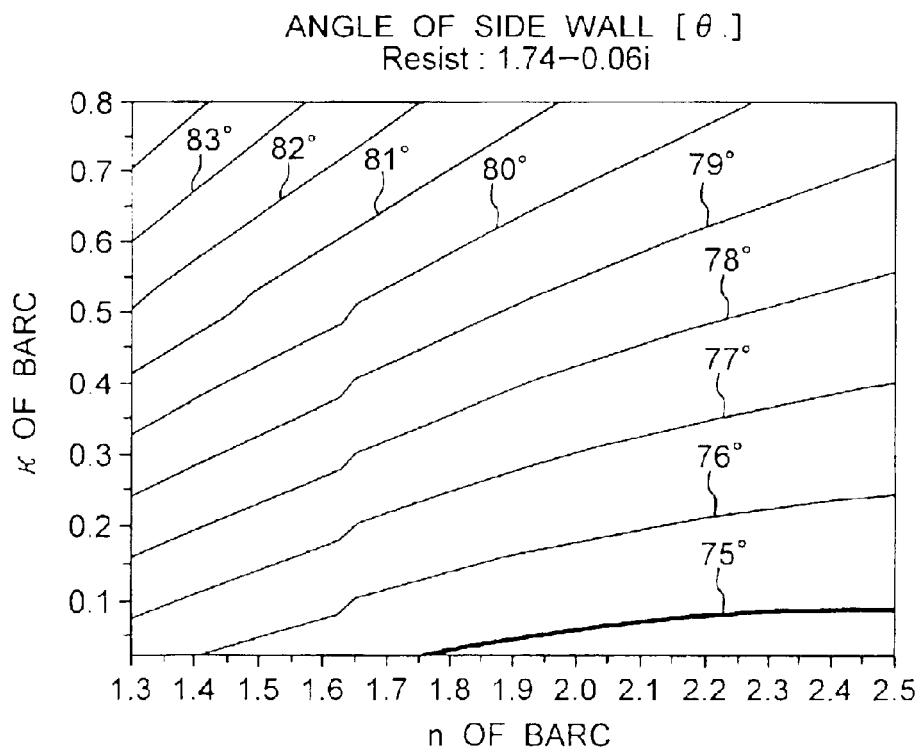
FIG. 17 is a graph showing the variation in side-wall θ due to an optical constant of an bottom antireflective layer when the complex index of refraction of a resist is 1.74–0.06i.

The variation in side wall angle θ due to the optical constant of the bottom antireflective layer is shown in FIG. 17. As described above, a desired range of pattern side wall angle θ on the processing is in the range of 75°≦θ≦95°.

As can be seen from the comparison of FIG. 7 with FIG. 17, the ranges of optical constants n and κ giving 75°≦θ in FIG. 17 are substantially coincident with the variation range of the thickness of the resist film ΔTr≦10 nm shown in FIG. 7 in Example 2.

As described above, according to this embodiment, it is possible to shorten the calculation time, and it is possible to obtain the substantially rectangular shape of the resist by changing the above described composition of the resist, in addition to the effect that the allowable variation range of the resist thickness which is defined by the performance of the device is expanded.

EXAMPLE 7

Figure 18:
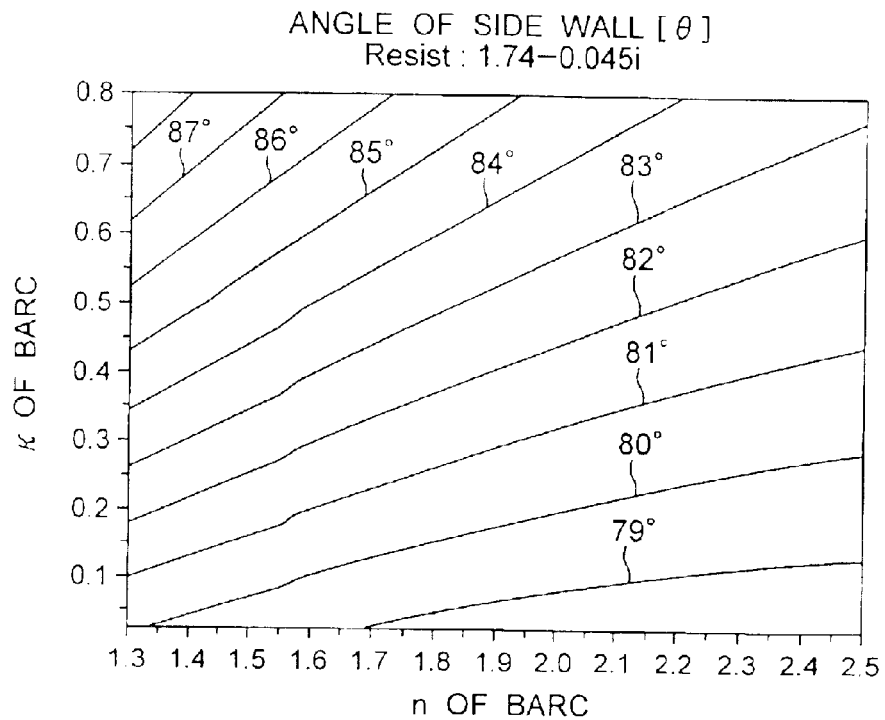
FIG. 18 is a graph showing the variation in side-wall θ due to an optical constant of an bottom antireflective layer when the complex index of refraction of a resist is 1.74–0.045i.

The same calculation as that in Example 6 was carried out when the complex index of refraction of the resist film was 1.74–0.045i. The variation in side wall angle θ due to the optical constant of the bottom antireflective layer is shown in FIG. 18.

As can be seen from the comparison with FIG. 10, it is possible to suppress the nominal dose in all common regions of the variation range of the resist thickness ΔTr≧10 nm in Example 3, and it is possible to acquire a desired optical constant of the bottom antireflective layer at the point of the side wall angle of the pattern.

EXAMPLE 8

Figure 19:
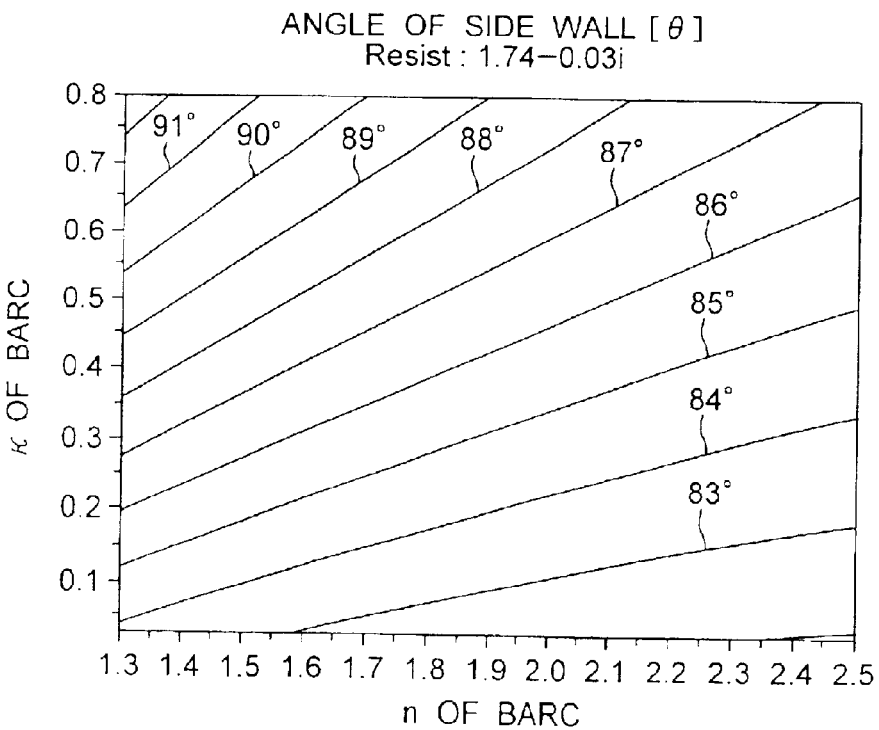
FIG. 19 is a graph showing the variation in side-wall θ due to an optical constant of an bottom antireflective layer when the complex index of refraction of a resist is 1.74–0.03i.

The same calculation as that in Example 6 was carried out when the complex index of refraction of the resist film was 1.74–0.03i. The variation in side wall angle θ due to the optical constant of the bottom antireflective layer is shown in FIG. 19.

As can be seen from the comparison with FIG. 12, it is possible to suppress the nominal dose in all common regions of the variation range of the resist thickness ΔTr≧10 nm in Example 4, and it is possible to acquire a desired optical constant of the bottom antireflective layer at the point of the side wall angle of the pattern.

EXAMPLE 9

Figure 20:
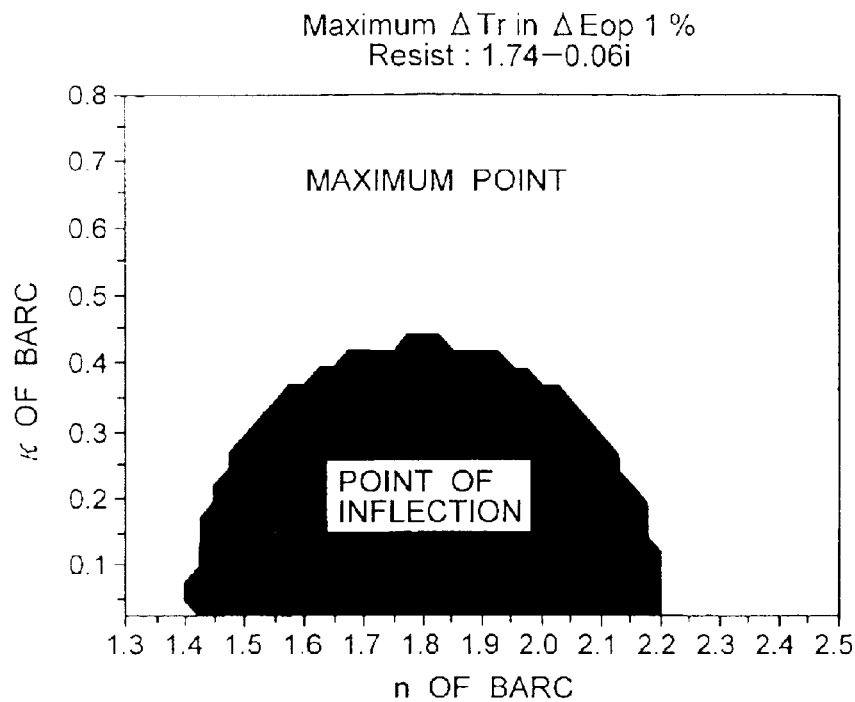
FIG. 20 is a graph showing the relationship between the magnitude of ΔTr based on the maximum point and the magnitude of ΔTr based on the point of inflection, with respect to dependence of the bottom antireflective layer shown in FIG. 7 on the optical constant.

With respect to the dependence of the bottom antireflective layer on the optical constant (see FIG. 7) giving the variation range of the resist thickness ΔTr in the variation range of the allowance nominal dose ΔEop=1% when the optical constant of the resist shown in Example 3 was 1.74–0.06i, the relationship between the magnitude of ΔTr based on the maximum point and the magnitude of ΔTr based on the point of inflection was examined. This relationship is shown in FIG. 20. It can be seen from FIG. 20 that all of regions of ΔTr≧15 nm in FIG. 17 are based on the point of inflection.

With respect to the optical constants of resist film of 1.74–0.045i and 1.74–0.03i, the same study was carried out.

Similar to the case where the optical constant of the resist film was 1.74–0.06i, the region of the variation range of the thickness of the resist film ΔTr≧15 nm was based on the point of inflection.

As pointed out with respect to the problems in the prior art, it is substantially impossible for the prior art to determine the optical constant of the bottom antireflective layer for suppressing the variation in thickness of the resist at the point of inflection. By using the vicinity of the point of inflection on the curve of the variation in nominal dose, which was one characteristic of this embodiment, it was shown that it was possible to determine the optical constant of the bottom antireflective layer capable of obtaining the variation range of the resist thickness ΔTr which is the same as that of 248 nm light described in Comparative Example 1.

EXAMPLE 10

Figure 21:
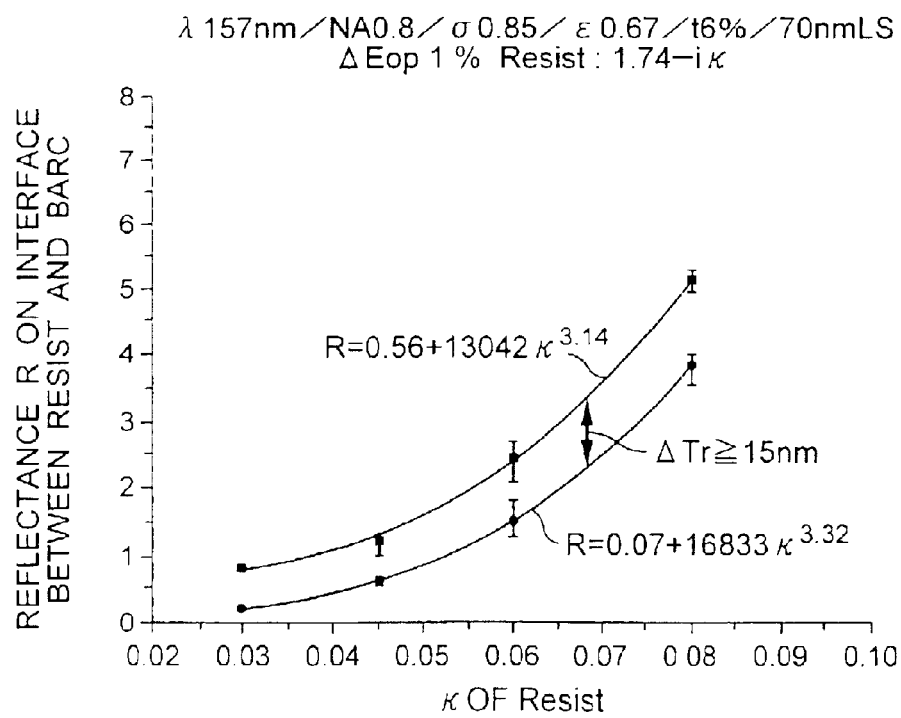
FIG. 21 is a graph showing a correlation between a range, in which a variation range of resist thickness ΔTr≧15 nm in ΔEop=1%, and a reflectance R on the interface between the resist film and an bottom antireflective layer, when the extinction coefficient κ' of the resist film having an optical constant 1.74-iκ' is changed.
Figure 22:
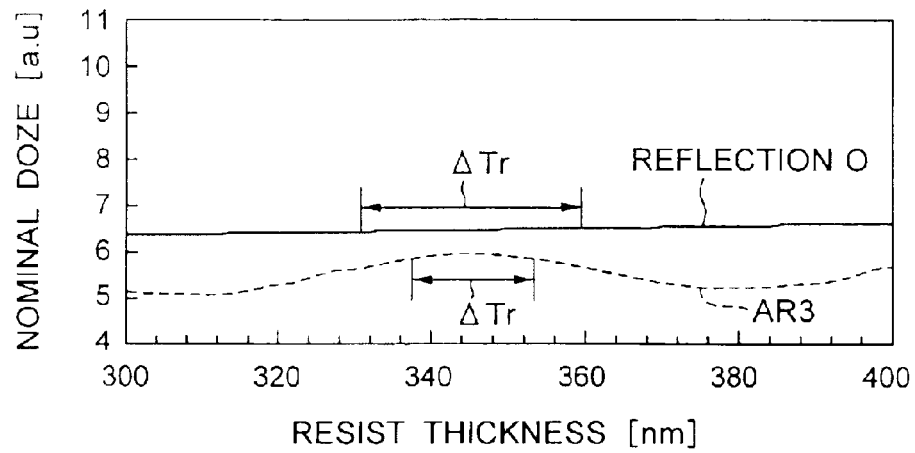
FIG. 22 is a graph showing the results of calculation of the variation of nominal dose ΔEop due to the resist thickness when the reflection on the interface between the resist film and an underlying substrate is 0, in the prior art.

From the results of Examples 2 through 4 and 9, when the refractive index n' of the optical constant n'-1κ' of the resist film is 1.74 and the extinction coefficient κ' is changed, the correlation between the range of ΔTr≧15 nm in ΔEop=1% and the reflectance R on the interface between the resist film and the bottom antireflective layer is shown in FIG. 21.

It was revealed from FIG. 21 that there was the following correlation between the above described interface intensity reflectance R and the extinction κ' of the resist film (optical constant n'-iκ').

$$0.56+13042\times(\kappa')^{3.14} \geq R \geq 0.07+16833\times(\kappa')^{3.32}$$

The region of the variation range of the resist thickness ΔTr≧15 nm is a region where ΔTr based on the point of inflection is greater than ΔTr based on the maximum value on the nominal dose curve with respect to the resist thickness. In this region, it is possible to efficiently determine the optical constant suitable for the bottom antireflective layer particularly by using the method in this embodiment.

While the embodiments of the present invention have been described above, the present invention should not be limited to the above described embodiments and examples, but the invention can be modified in various ways within the scope thereof. In addition, while the idea of the nominal dose has been used in the above described embodiments, the calculation of the quantity of absorbed light or variation in dimension may be substituted for the idea of the nominal dose. If an idea other than the nominal dose is used for carrying out calculation, the variation serving as a standard for determining the allowable variation of the resist thickness ΔTr may be suitably transduced from the allowable variation range of the nominal dose.

What is claimed is:

1. A method for determining an optical constant of an bottom antireflective layer formed between a resist film and an underlying substrate in an optical lithography process in a process for fabricating a semiconductor device, said resist film having an absorption coefficient α' of 1.5 μm$^{-1}$ to 3.0 μm$^{-1}$ with respect to an exposure wavelength, a base of the absorption coefficient α' being 10, said method comprising:

expressing an nominal dose due to a variation in thickness of said resist film by the sum of a monotonic increase term and a damped oscillation term; and selecting an optical constant of said bottom antireflective layer so that a minimum value closing to a maximum point indicative of a maximum value on a curve of a variation in said nominal dose on a side that the thickness is larger than that at said maximum point is substantially equal to said maximum value, or so that no maximum point exist on said curve;

wherein, expressing an exposure wavelength by λ and an extinction coefficient of the resist film by κ, said absorption coefficient α' is a value having the following relationship with the λ and the κ;

$$\alpha' = \frac{4\pi\kappa}{\lambda}\log_{10}(\exp).$$

2. A method for determining an optical constant of a bottom antireflective layer according to claim 1, wherein a difference between said minimum value and said maximum value is 1% or less of said maximum value.

3. A method for determining an optical constant of an bottom antireflective layer according to claim 1, wherein assuming that a thickness of said resist film is Tr and a ratio of the circumference of a circle to its diameter is π, said nominal dose is expressed by the following expression using variables A, B, C, D, E and F determined by an optical constant of said underlying substrate and said thickness Tr of said resist film;

$$A \times \exp(B \times Tr) + C \times \exp(-D \times Tr) \times \sin\left(\frac{2\pi}{F}(Tr - E)\right).$$

4. A method for determining an optical constant of a bottom antireflective layer according to claim 1, which further comprises:

carrying out a diffusion calculation using a first electric field intensity as an initial value therefore, said first electric field intensity being an electric field intensity in said resist film having a desired pattern; and calculating a second electric field intensity which is an electric field intensity which gives a desired pattern dimension corresponding to a result of said diffusion calculation;

wherein said nominal dose is calculated from said second electric field intensity.

5. A method for determining an optical constant of an bottom antireflective layer according to claim 1, which further comprises selecting said optical constant so that an angle of a side wall of a desired resist pattern is in the range from 75° to 95°.

6. A method for determining an optical constant of a bottom antireflective layer according to claim 5, which further comprises:

connecting values equal to each other of values of said second electric field intensity to form a curve; and regarding said curve as a shape of a cross section of said resist pattern to calculate the angle of the side wall of said resist pattern.

7. A method for forming a resist pattern for use in an optical lithography process for forming an bottom antireflective layer having an optical constant of n-iκ and a thickness d of 8.193/κ [nm] on an underlying substrate for fabrication of a semiconductor device, and for forming a resist film on said bottom antireflective layer, said method comprising:

using a light source which emits rays of light having a wavelength of 157 nm, and a resist film which has an absorption coefficient of α' of 1.5 μm⁻¹ to 3.0 μm⁻¹ with respect to an exposure wavelength, a base of said absorption coefficient α' being 10, and which contains fluorine containing resin or siloxane resin;

wherein an optical constant n-iκ of said bottom antireflective layer is included in a range determined by being selected so that an nominal dose due to a variation in thickness of said resist film is expressed by the sum of a monotonic increase term and a damped oscillation term and so that a minimum value closing to a maximum point indicative of a maximum value on a curve of variation in said nominal dose on a side that the thickness is larger than that at said maximum point is substantially equal to said maximum value, or so that no maximum point exist on said curve, and expressing an exposure wavelength by λ and an extinction coefficient of the resist film by κ, said absorption coefficient α' is a value having the following relationship with λ and the κ;

$$\alpha' = \frac{4\pi\kappa}{\lambda}\log_{10}(\exp)$$

8. A method for forming a resist pattern according to claim 7, wherein a difference between said minimum value and said maximum value is 1% or less of said maximum value.

9. A method for forming a resist pattern according to claim 7, wherein assuming that a thickness of said resist film is Tr and a ratio of the circumference of a circle to its diameter is π, said nominal dose is expressed by the following expression using variables A, B, C, D, E and F determined by an optical constant of said underlying substrate and said thickness Tr of said resist film;

$$A \times \exp(B \times Tr) + C \times \exp(-D \times Tr) \times \sin\left(\frac{2\pi}{F}(Tr - E)\right).$$

10. A method for forming a resist pattern according to claim 7, which further comprises:

carrying out a diffusion calculation using a first electric field intensity as an initial value therefore, said first electric field intensity being an electric field intensity in said resist film having a desired pattern; and calculating a second electric field intensity which is an electric field intensity which gives a desired pattern dimension corresponding to a result of said diffusion calculation;

wherein said nominal dose is calculated from said second electric field intensity.

11. A method for determining an optical constant of an bottom antireflective layer according to claim 7, which further comprises selecting said optical constant so that an angle of a side wall of a desired resist pattern is in the range from 75° to 95°.

12. A method for forming a resist pattern according to claim 11, which further comprises:

connecting values equal to each other of values of said second electric field intensity to form a curve; and regarding said curve as a shape of a cross section of said resist pattern to calculate the angle of the side wall of said resist pattern.

13. A method for forming a resist pattern using an optical lithography process for forming an bottom antireflective layer having an optical constant of n-iκ and a thickness d of 8.193/κ [nm] on an underlying substrate for a semiconductor device to be fabricated and for forming a resist film on said bottom antireflective layer, said method comprising:

using a light source emitting rays of light having a wavelength of 157 nm, and a resist film containing a fluorine containing resin or siloxane resin; and selecting an intensity reflectance R on the interface between said resist film and said antireflective layer so as to meet the following expression, assuming that an optical constant of said resist film is n'-iκ';

$$2.06+17677\times(\kappa')^{3.25} \geq R \geq 0.01+14059\times(\kappa')_{3.37}.$$

14. A method for forming a resist pattern used in an optical lithography process for forming an bottom antireflective layer having an optical constant of n-iκ and a thickness d of 8.193/κ [nm] on an underlying substrate for a semiconductor device to be fabricated, and for forming a resist film on said bottom antireflective layer, said method comprising:

using a light source emitting rays of light having a wavelength of 157 nm, and a resist film containing a fluorine containing resin or siloxane resin; and selecting an intensity reflectance R on the interface between said resist film and said antireflective layer so as to meet the following expression assuming that an optical constant of said resist film is n'-iκ';

$$0.56+13042\times(\kappa')^{3.14} \geq R \geq 0.07+16833\times(\kappa')^{3.32}.$$

* * * * *